(12) United States Patent
Kobayashi et al.

(10) Patent No.: US 6,992,008 B2
(45) Date of Patent: Jan. 31, 2006

(54) METHOD OF MAKING A SUBSTRATE HAVING BURIED STRUCTURE AND METHOD FOR FABRICATING A DISPLAY DEVICE INCLUDING THE SUBSTRATE

(75) Inventors: Kazuki Kobayashi, Izumi (JP); Kimiaki Fujino, Kashihara (JP); Ikuo Sakono, Soraku-gun (JP); Tadahiro Ohmi, 2-1-17-301, Komegafukuro, Aoba-ku, Miyagi, Sendai 980-0813 (JP); Shigetoshi Sugawa, Atsugi (JP); Akihiro Morimoto, Sendai (JP)

(73) Assignees: Sharp Kabushiki Kaisha, Osaka (JP); Tadahiro Ohmi, Miyagi (JP)

( * ) Notice: Subject to any disclaimer, the term of this patent is extended or adjusted under 35 U.S.C. 154(b) by 0 days.

(21) Appl. No.: 10/956,886

(22) Filed: Oct. 1, 2004

(65) Prior Publication Data

US 2005/0040526 A1 Feb. 24, 2005

Related U.S. Application Data

(62) Division of application No. 10/227,121, filed on Aug. 23, 2002, now Pat. No. 6,815,720.

(30) Foreign Application Priority Data

Aug. 24, 2001 (JP) ........................ 2001-255353

(51) Int. Cl.
*H01L 21/302* (2006.01)
*H01L 21/461* (2006.01)

(52) U.S. Cl. ........................ 438/689; 438/723

(58) Field of Classification Search .......... 438/689, 438/723
See application file for complete search history.

(56) References Cited

U.S. PATENT DOCUMENTS

| 4,352,724 | A | * | 10/1982 | Sugishima et al. ..... 204/192.37 |
|---|---|---|---|---|
| 5,091,053 | A | | 2/1992 | Blonder et al. |
| 5,188,973 | A | | 2/1993 | Omura et al. |
| 5,247,191 | A | | 9/1993 | Yamazaki et al. |
| 6,008,877 | A | | 12/1999 | Akiyama et al. |
| 6,387,742 | B2 | | 5/2002 | Gauthier et al. |
| 6,393,186 | B1 | | 5/2002 | Deacon |
| 6,452,210 | B2 | | 9/2002 | Lee |
| 6,727,187 | B2 | * | 4/2004 | Takeshima et al. ......... 438/745 |

FOREIGN PATENT DOCUMENTS

| JP | 3-107128 | 5/1991 |
|---|---|---|
| JP | 3-29903 | 7/1991 |
| JP | 03-297134 | 12/1991 |

(Continued)

OTHER PUBLICATIONS

Office Action from Korean Intellectual Property Office for corresponding Korean Application No. 10–2002–49762 mailed Jun. 25, 2004.

*Primary Examiner*—David S. Blum
(74) *Attorney, Agent, or Firm*—Edwards Angell Palmer & Dodge LLP; David G. Conlin; George W. Hartnell, III

(57) ABSTRACT

A method of making a substrate having a buried structure includes the steps of preparing a glass substrate having a principal surface, forming a groove on the principal surface of the glass substrate by a wet etching process, and depositing a first material over the principal surface of the glass substrate and filling the groove with the first material to form the buried structure having a surface that is substantially flush with the principal surface. The step of forming the groove includes the step of performing the wet etching process by using an etchant that includes hydrofluoric acid, ammonium fluoride, and hydrochloric acid or oxalic acid.

16 Claims, 6 Drawing Sheets

FOREIGN PATENT DOCUMENTS

| | | |
|---|---|---|
| JP | 04-090514 | 3/1992 |
| JP | 4-170519 | 6/1992 |
| JP | 06-163516 | 6/1994 |
| JP | 06-163583 | 6/1994 |
| JP | 6-340448 | 12/1994 |
| JP | 7-333648 | 12/1995 |
| JP | 08-054647 | 2/1996 |
| JP | 08-203132 | 8/1996 |
| JP | 09-230371 | 9/1997 |
| JP | 11-025454 | 1/1999 |

* cited by examiner

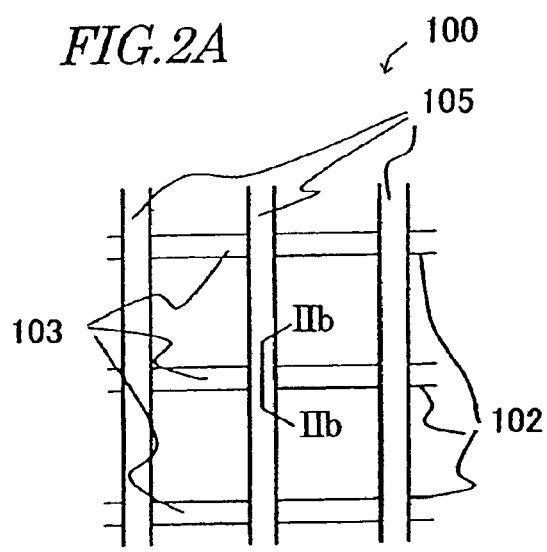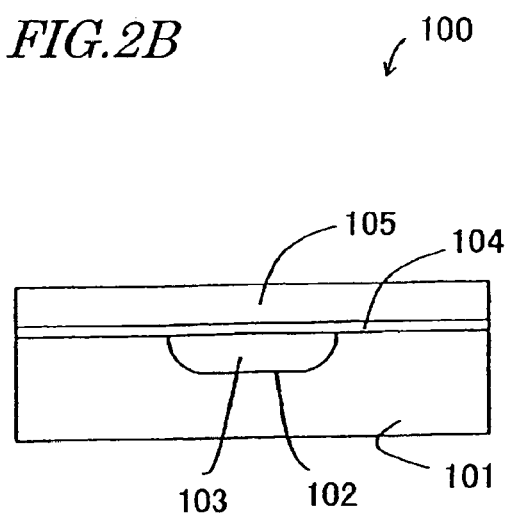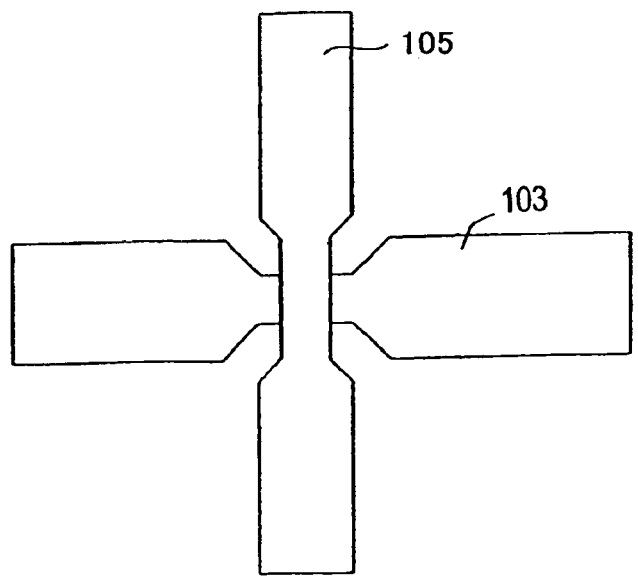

METHOD OF MAKING A SUBSTRATE HAVING BURIED STRUCTURE AND METHOD FOR FABRICATING A DISPLAY DEVICE INCLUDING THE SUBSTRATE

CROSS REFERENCE TO RELATED APPLICATIONS

This application is a divisional of U.S. Ser. No. 10/227,121, filed Aug. 23, 2002 now U.S. Pat. No. 6,815,720.

BACKGROUND OF THE INVENTION

1. Field of the Invention

The present invention relates to a substrate having a buried structure that serves as an interconnect, a black matrix (light blocking film) or a waveguide. The present invention also relates to a display device including such a substrate, a method of making the substrate and a method of fabricating the display device.

2. Description of the Related Art

Various types of display devices currently under development, including liquid crystal display devices and organic EL display devices, have been reducing their thicknesses and increasing their definition or screen size day after day. These display devices with reduced thicknesses may be driven by various techniques. Among other things, an active-matrix addressing technique contributes particularly effectively to the improvement of display definition.

An active-matrix addressed display device includes multiple active components (e.g., TFTs or MIMS), each being provided for an associated one of its pixels. In a display device of this type, the optical state of a pixel is changeable by way of its associated active component. Each active component is formed on a glass substrate and connected to a gate line and a source line. For example, a TFT, which is provided for associated one of pixels that are arranged in columns and rows (i.e., in matrix), is connected to a gate line (or scan line) and a source line (or data line) that intersect with each other.

A glass substrate, on which multiple active components are formed in matrix in this manner (which is often called an "active-matrix substrate"), normally has a structure in which multiple gate lines and multiple source lines cross each other. For example, an active-matrix substrate may be formed in such a manner that the source lines extend over, and overlap with, the gate lines. In that case, although an insulating film is interposed between each gate line and associated one of the source lines, the source line still has to get over level differences that are created by the gate line.

Accordingly, to prevent the source line from being discontinued by the level differences created by the gate line or to keep the orientation state of liquid crystal molecules in a liquid crystal display device from being disturbed by those level differences on the surface of the substrate, the level differences need to either reduce its height (or thickness) or decrease the angle that the level differences define with respect to the surface of the substrate. On the other hand, the gate lines and source lines should have resistance that is low enough to transmit a predetermined electric signal at a sufficiently high rate. To satisfy these requirements, interconnects, including the gate and source lines, on a conventional active-matrix substrate have their thickness limited (e.g., to 0.3 $\mu$m or less) so as not to be discontinued (or disconnected) by those level differences and also have their width adjusted so as to reduce their resistance sufficiently. The interconnects sometimes have tapered side surfaces for these purposes.

In this manner, according to the conventional techniques, an interconnect having a limited thickness should have its width adjusted to obtain a desired resistance value. That is to say, the conventional techniques allow only a low degree of flexibility for the interconnects being designed. Thus, in a transmission type liquid crystal display device, for example, the aperture ratio thereof has to be sacrificed to make the interconnects satisfy those requirements. It is already known that a display device having a diagonal size of greater than 10 inches has its aperture ratio adversely limited by such an interconnection structure.

In a transmission type liquid crystal display device, however, as its aperture ratio decreases, the luminance of the image displayed thereon decreases or the power dissipation thereof increases. Accordingly, to enhance the performance of a transmission type display device, interconnects having a narrow line width and a sufficiently low resistance value need to be realized.

To overcome these problems, a method of reducing the thickness of the level differences on the substrate and realizing interconnects with a sufficiently low resistance value was proposed in Japanese Laid-Open Publication No. 4-170519, for example. According to this proposed method, an interconnect, having a thickness greater than that of the conventional one, is embedded in a groove that has been formed on the surface of a substrate. An interconnect of this type will be herein referred to as an "inlaid interconnect".

However, the technique of forming such an inlaid interconnect on the surface of a glass substrate has not been established yet. For that reason, Japanese Laid-Open Publication No. 4-170519 identified above provides no disclosure about a specific method of forming the groove on the surface of a glass substrate. The present inventors discovered and confirmed via experiments that when a glass substrate was wet-etched by using a conventional etchant as a mixture of hydrofluoric acid and ammonium fluoride, the surface could not be etched uniformly or at a sufficiently high rate or might have a groove with a width that had been unnecessarily broadened by an abnormal side-etching phenomenon. If the surface of a glass substrate is etched non-uniformly, then the etched surface will scatter light excessively to make the displayed image whitened.

SUMMARY OF THE INVENTION

In order to overcome the problems described above, preferred embodiments of the present invention provide a substrate having a buried structure such as the inlaid interconnect on the glass substrate and also provide a display device including such a substrate, a method of making the substrate, and a method of fabricating the display device.

A preferred embodiment of the present invention provides a method of making a substrate having a buried structure. The method preferably includes the steps of preparing a glass substrate having a principal surface, forming a groove on the principal surface of the glass substrate by a wet etching process, and depositing a first material over the principal surface of the glass substrate and filling the groove with the first material to form the buried structure having a surface that is substantially flush with the principal surface. The step of forming the groove preferably includes the step of performing the wet etching process by using an etchant that includes hydrofluoric acid, ammonium fluoride, and hydrochloric acid or oxalic acid.

In one preferred embodiment of the present invention, the step of forming the groove preferably includes the step of forming the groove that satisfies a relationship d≧r, where d is the depth of the groove and r is a radius of curvature of a sidewall of the groove. Specifically, the groove may have a depth d of 0.5 μm or more.

In another preferred embodiment of the present invention, the step of preparing the glass substrate preferably includes the step of preparing the glass substrate that is mainly composed of silicon dioxide and that additionally includes a non-silicon-dioxide metal oxide. Specifically, the glass substrate may be made of either non-alkali glass or soda lime glass.

In still another preferred embodiment, the step of forming the groove preferably includes the step of defining an etching mask that exposes a region of the principal surface of the glass substrate in which the groove will be formed. The step of forming the buried structure preferably includes the step of removing the first material from the principal surface of the glass substrate, except a portion of the first material that fills the groove, by a lift-off process using the etching mask.

In this particular preferred embodiment, the step of forming the groove preferably further includes the step of subjecting the principal surface of the glass substrate to a surface treatment to make the etching mask contact with the principal surface more closely before the step of defining the etching mask is performed.

More particularly, the step of forming the groove preferably includes the steps of subjecting the principal surface to a silylation process as the surface treatment and defining a photoresist pattern as the etching mask on the principal surface.

In yet another preferred embodiment, the step of depositing the first material preferably includes the step of depositing the first material by a sputtering process.

In yet another preferred embodiment, the step of depositing the first material may include the steps of depositing a conductive material as the first material and forming an interconnect as the buried structure. Alternatively, the step of depositing the first material may include the step of depositing a light blocking material as the first material and forming a black matrix as the buried structure.

As another alternative, the step of depositing the first material may include the steps of depositing a transparent material as the first material and forming a waveguide as the buried structure.

Another preferred embodiment of the present invention provides a method for fabricating a display device that includes an active-matrix substrate and a display medium layer. The method preferably includes the step of making the active-matrix substrate by the method of making the substrate with the buried structure by using the conductive or light blocking material.

In one preferred embodiment of the present invention, the buried structure may be a gate line. In that case, the step of making the active-matrix substrate preferably includes the step of forming a reverse staggered TFT on the gate line.

In an alternative preferred embodiment, the buried structure may be a source line. In that case, the step of making the active-matrix substrate preferably includes the step of forming a staggered TFT on the source line.

A substrate according to still another preferred embodiment of the present invention preferably includes a glass plate having a groove that has been formed on the principal surface thereof, and a buried structure. The buried structure is preferably made of a first material that has been deposited on the principal surface so as to fill the groove and preferably has a surface that is substantially flush the principal surface. The groove preferably satisfies a relationship $d \geq r$, where d is the depth of the groove and r is a radius of curvature of a sidewall of the groove.

In one preferred embodiment of the present invention, an inner surface of the groove preferably has a roughness that is one-tenth or less of the depth d of the groove. This is because the present inventors discovered and confirmed via experiments that when the inner surface of the groove had a roughness greater than this value, the dielectric strength of the interlevel dielectric layer decreased, an increased amount of leakage current flowed between the lines or the lines were disconnected. Such a substrate may be made by the method according to any of the preferred embodiments of the present invention described above.

In another preferred embodiment of the present invention, the first material may be a conductive material and the buried structure may be an interconnect. In an alternative preferred embodiment, the first material may be a light blocking material and the buried structure may be a black matrix.

As another alternative, the first material may also be a transparent material and the buried structure may also be a waveguide.

Yet another preferred embodiment of the present invention provides a display device. The display device preferably includes an active-matrix substrate that has been formed by using the conductive or light blocking material and a display medium layer.

In one preferred embodiment of the present invention, the buried structure may be a gate line and the active-matrix substrate may include a reverse staggered TFT that has been formed on the gate line.

In an alternative preferred embodiment, the buried structure may also be a source line and the active-matrix substrate may include a staggered TFT that has been formed on the source line.

Other features, elements, processes, steps, characteristics and advantages of the present invention will become more apparent from the following detailed description of preferred embodiments of the present invention with reference to the attached drawings.

BRIEF DESCRIPTION OF THE DRAWINGS

FIGS. 2A, 2B and 2C schematically illustrate the structure of an active-matrix substrate according to a specific preferred embodiment of the present invention.

DETAILED DESCRIPTION OF PREFERRED EMBODIMENTS

Figure 1A:
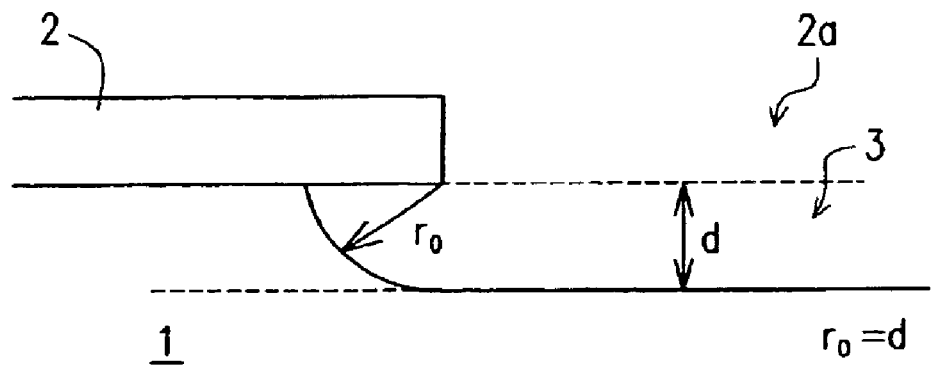
FIGS. 1A, 1B and 1C are cross-sectional views showing what problems arise when a conventional etchant is used to etch a glass substrate.

In the present invention, to form a desired buried structure, it is important to use an etchant that can etch glass uniformly and at a sufficiently high rate. This object can be achieved by using an etchant that includes hydrofluoric acid, ammonium fluoride, and hydrochloric acid (HCl) or oxalic acid (HBr).

First, it will be described what problems will arise when glass is etched by using a conventional etchant that includes hydrofluoric acid (HF) and ammonium fluoride ($NH_4F$). This conventional etchant will be herein referred to as an "HF+$NH_4F$-based etchant" or "buffered hydrofluoric acid-based etchant". In the prior art, glass was sometimes etched by using a hydrofluoric acid-based etchant. In that case, however, a non-uniform concentration distribution of hydrofluoric acid was easily formed in the etchant, and therefore, glass could not be etched so uniformly. For that reason, the HF+$NH_4F$-based etchant having buffering action is now used extensively.

The HF+$NH_4F$-based etchant reacts with non-silicon metal elements (e.g., Al, Ba, Ca and Mg) that are normally included in glass (i.e., glass silicate), thereby producing metal salts. Some of these metal salts (e.g., a Ba salt) are slightly soluble in an etchant (i.e., an aqueous solution). If these slightly soluble metal salts are produced on the surface being etched or if the metal salts, which are floating as impurity particles in an etchant, are deposited on the surface being etched, then portions of the surface that have been covered with those metal salts will not be etched anymore. As a result, the surface being etched will have an increased roughness.

In addition, a filter, which is provided for the channel of an etching bath to circulate the etchant smoothly, might be clogged up with those particles of the slightly soluble metal salts, thus possibly interfering with good circulation of the etchant. In that case, it would be difficult to etch a large glass substrate having a diagonal size of more than 10 inches uniformly.

However, the present inventors discovered and confirmed via experiments that when hydrochloric acid was added to the HF+$NH_4F$-based etchant, those metal salts, other silicon dioxide and silicon, increased their solubility. Hereinafter, these effects achieved by adding hydrochloric acid will be described in detail. In the following illustrative example, the glass substrate is supposed to be made of soda lime glass. It should be noted, however, that the same statements are also applicable to a situation where the glass substrate is made of non-alkali glass.

By adding hydrochloric acid to an etchant as a 1:3 mixture of hydrofluoric acid and ammonium fluoride (unit: mol/kg), the metal salts increase their solubility and the etched surface has a decreased roughness as a result. However, if hydrochloric acid is added excessively, then the roughness tends to increase again. Accordingly, the amount of the hydrochloric acid to be added should preferably be controlled in such a manner as to dissolve the metal salts sufficiently and yet not to increase the roughness of the etched surface excessively. The amount of the hydrochloric acid to be added is changeable with the composition of the glass to be etched but is preferably in the range of 3 mol/kg to 5 mol/kg.

In this manner, by using such an etchant including hydrofluoric acid, ammonium fluoride and hydrochloric acid, it is possible to prevent those slightly soluble metal salts from covering the surface being etched. Thus, an etched surface having a small surface roughness (specifically, one-tenth or less of the depth d of the groove that has been formed by the etching process) can be obtained.

Furthermore, since it is also possible to prevent the unwanted particles of the metal salts from floating in the etchant, the entire surface of the glass substrate can be uniformly covered with the etchant supplied. Thus, even a large glass substrate having a diagonal size of more than 10 inches can be etched uniformly over the entire surface thereof.

As described above, those slightly soluble metal salts, which often make the etched surface non-uniform, can be dissolved by adding hydrochloric acid to the HF+$NH_4F$-based etchant. However, the same effects are achievable by adding oxalic acid instead of hydrochloric acid.

Hereinafter, it will be described with reference to FIGS. 1A, 1B and 1C specifically what problems will arise when a groove is formed on a glass substrate by using the conventional HF+$NH_4F$-based etchant.

Normally, a wet etching process is isotropic in nature. Accordingly, if an etching mask 2 is formed on the surface of a glass substrate 1 and if a groove 3 having a depth d is formed by etching away a portion of the glass substrate 1 that is exposed inside an opening 2a of the etching mask 2, the radius of curvature $r_0$ of the sidewall of the groove 3 should ideally be equal to the depth d of the groove 3 (i.e., $r_0$=d) as shown in FIG. 1A.

Figure 1B:
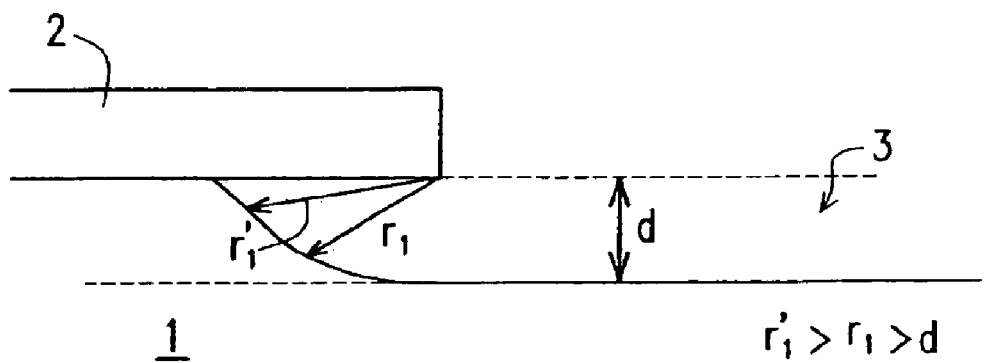
Figure 1C:
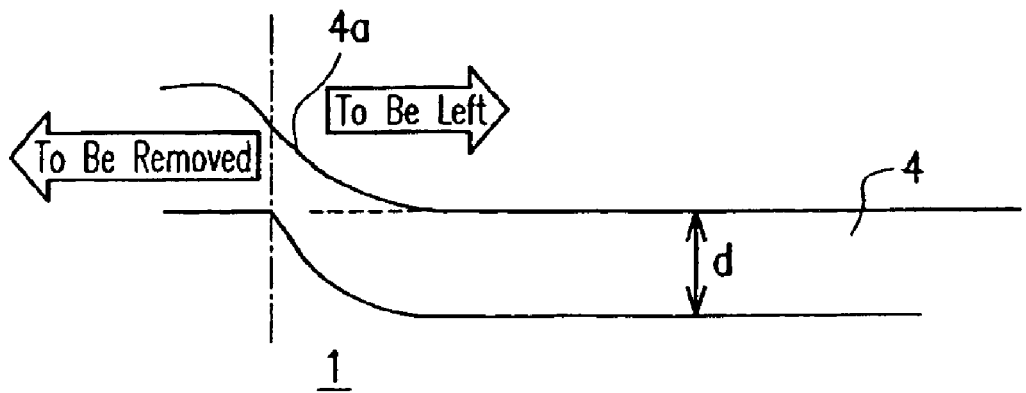

Actually, though, when the glass substrate 1 is etched by using the HF+$NH_4F$-based etchant, the glass substrate 1 is side-etched excessively (or abnormally) and the radius of curvature $r_1$ of the sidewall of the groove 3 becomes greater than the depth d of the groove 3 (i.e., $r_1$>d) as shown in FIG. 1B. In FIG. 1B, the radius of curvature $r_1$ is an average of the radii of curvature of the sidewall that has been formed between the surface of the glass substrate 1 and the bottom of the groove 3. Such an abnormal side-etching phenomenon occurs because the etchant likely permeates the interface between the etching mask 2 and the glass substrate 1 to start and advance the etching reaction at the interface. Accordingly, as schematically illustrated in FIG. 1B, the closer to the surface of the glass substrate 1, the greater the radius of curvature $r_1'$ of a portion of the sidewall of the groove 3. Such a side-etching reaction that advances excessively compared to the ideal side-etching reaction shown in FIG. 1A will be herein referred to as an "abnormal side-etching phenomenon".

If a metal material (e.g., Al) 4 is deposited by a sputtering process, for example, over the glass substrate 1 so as to fill the groove 3, in which the sidewall having the radius of curvature $r_1$ that is greater than the depth d of the groove 3 has been formed as a result of that abnormal side-etching phenomenon, with the metal material 4, then the metal material 4 will be deposited on those portions of the glass substrate 1 having the relatively great radius of curvature $r_1$ at a higher rate than other portions of the glass substrate 1 having a relatively small radius of curvature. Accordingly, as schematically illustrated in FIG. 1C, the metal material 4a that has been deposited on those portions of the glass substrate 1 that have been side-etched abnormally will be raised from the surface of the glass substrate 1. In that case, even if the excessive portions of the metal material 4 deposited are removed afterward by a photolithographic process, for example, the metal material 4a that was deposited on those abnormally side-etched portions of the glass substrate 1 will still create some level differences.

The abnormal side-etching phenomenon described above is brought about by the permeation of the HF+$NH_4F$-based etchant into the interface between the etching mask 2 (typically, a photoresist pattern) and the glass substrate 1 because glass is etched by the $HF+NH_4F$-based etchant relatively slowly.

In a method for forming a buried structure according to a preferred embodiment of the present invention, an etchant including hydrofluoric acid, ammonium fluoride and hydrochloric acid or oxalic acid is used. Thus, compared to the situation where the conventional $HF+NH_4F$-based etchant is used, the etch rate can be increased according to the present invention. Accordingly, before the etchant permeates the interface between the glass substrate 1 and the etching mask 2 to start the etching reaction there, the groove 3 can be formed to the predetermined depth d. As a result, the groove 3 shown in FIG. 1A, having a radius of curvature $r_0$ that is substantially equal to the depth d, can be formed. And when the metal material 4 is deposited by a sputtering process, for example, so as to fill the groove 3 having the cross-sectional shape shown in FIG. 1A, a buried structure having a surface that is substantially flush with the surface of the glass substrate 1 can be formed. This is because the closer to the surface of the glass substrate 1 a portion of the sidewall of the groove 3 is (i.e., the closer to 90 degrees the angle defined by that portion of the sidewall with respect to the surface of the glass substrate 1 is), the lower the deposition rate will be.

As described above, by using the etchant according to the preferred embodiment of the present invention, the unwanted metal salts that will make the etched surface non-uniform can be substantially eliminated, a sufficiently high etch rate is realized and the abnormal side-etching phenomenon can be minimized.

The abnormal side-etching phenomenon can also be minimized by increasing the degree of contact between the surface of the glass substrate 1 and the etching mask 2. For example, before a photoresist layer to be patterned into the etching mask 2 is formed on the surface of the glass substrate 1, the surface of the glass substrate 1 may be silylated. Then, the degree of contact can be increased. In this case, if the interface between the glass substrate 1 and the etching mask 2 is made hydrophobic (or water repellent) by subjecting the surface of the glass substrate 1 to the silylation process, then the etchant will not enter the interface and the abnormal side-etching phenomenon can be minimized. In addition, the side-etching reaction itself hardly occurs on the sidewall. Thus, the resultant groove 3 can have a cross-sectional shape in which the radius of curvature r of the sidewall is smaller than the depth d (i.e., r<d). That is to say, by making the interface hydrophobic, the etching process can be performed anisotropically.

Examples of such silylation reagents that can increase the degree of contact between the surface of the glass substrate 1 and the photoresist layer and that can make the interface hydrophobic include hexamethyldisilane (HMDS).

When such an etchant including hydrofluoric acid, ammonium fluoride and hydrochloric acid or oxalic acid is used, the etched surface can have a decreased roughness and a groove having such a cross-sectional shape as having a much smaller number of abnormally side-etched portions can be formed at a much faster rate than the conventional process. A buried structure is obtained by filling the groove, which has been formed by using such an etchant, with any of various types of materials that has been deposited by one of a number of deposition techniques. Then, any arbitrary type of devices can be formed.

For example, if the groove is filled with a conductive material (e.g., a metal material, ITO or a semiconductor material) that has been deposited by a sputtering process, for example, then an inlaid interconnect may be formed. This interconnect is formed so as to have a surface that is substantially flush with the surface of the glass substrate. Accordingly, a TFT, another interconnect or any other member to be formed on the inlaid interconnect is not affected by any level differences.

Also, the groove can be formed to a depth of 0.5 $\mu$m or more, for example. Accordingly, a thicker interconnect with a narrower width can be formed. Such an inlaid interconnect is applicable to an active-matrix substrate for use in a liquid crystal display device, an organic EL display device and so on as described in the background of the invention. Then, the aperture ratio can be increased or a capacitance that is created at an intersection between interconnects can be reduced.

For example, when the inlaid interconnect is formed as a gate line, a reverse staggered TFT may be formed on the gate line. On the other hand, when the inlaid interconnect is formed as a source line, a staggered TFT may be formed on the source line.

Alternatively, if the groove is filled with a light blocking material deposited, an embedded black matrix may be formed as disclosed in Japanese Laid-Open Publication No. 3-107128.

In a method of forming a buried structure according to a preferred embodiment of the present invention, when the etchant including hydrofluoric acid, ammonium fluoride and hydrochloric acid or oxalic acid is used, an etched surface having a small roughness can be formed. Accordingly, a glass substrate with such an etched surface will not scatter incoming light and the image displayed will not look whitened. Therefore, even when a glass substrate with such an etched surface is used as a transparent substrate for a display device (e.g., as an active-matrix substrate or a color filter substrate), the resultant display quality will not degrade (e.g., the transmittance thereof will not decrease).

Furthermore, according to another preferred embodiment of the present invention, an embedded waveguide may also be formed by filling the groove with a transparent material deposited as disclosed in Japanese Laid-Open Publication No. 3-29903. When the etchant according to the preferred embodiment of the present invention is used, an etched surface with a small roughness is formed. Accordingly, the etched surface neither scatters incoming light nor increases the loss of the light that is transmitted through the waveguide.

Hereinafter, an active-matrix substrate having an inlaid interconnect according to a preferred embodiment of the present invention will be described with reference to FIGS. 2A and 2B. FIG. 2A is a plan view of an active-matrix substrate 100 and FIG. 2B is a cross-sectional view thereof taken along the line IIb—IIb shown in FIG. 2A.

As shown in FIG. 2B, a gate line 103 has been inlaid in a groove 102 that has been formed on the surface of a glass substrate 101 by a method to be described later by using an etchant including hydrofluoric acid, ammonium fluoride and hydrochloric acid or oxalic acid. In this case, the groove 102 satisfies the relationship r≦d, where r is the radius of curvature of the sidewall of the groove 102 and d is the depth of the groove 102. Accordingly, the gate line 103, which has been formed by filling the groove 102 with Al that has been deposited by a sputtering process, for example, has a surface that is substantially flush with the surface of the glass substrate 101. A gate insulating film 104 has been deposited almost over the entire surface of the glass substrate 101 as shown in FIG. 2B. Multiple source lines 105 have been formed on the gate insulating film 104 as shown in FIGS. 2A and 2B. The gate lines 103 have been inlaid in the glass substrate 101 so as to have a surface that is substantially flush with the surface of the glass substrate 101. Accordingly, the gate insulating film 104 that has been deposited on the gate lines 103 and the glass substrate 101 also has a substantially flat surface, on which flat surface the source lines 105 have been formed. Thus, there is no concern about disconnection of any of the source lines 105 at the intersections between the source line 105 and the gate lines 103. By forming reverse staggered TFTs (not shown) and other members (e.g., pixel electrodes) on these inlaid gate lines 103 by known techniques, the active-matrix substrate 100 can be obtained.

The inlaid interconnect according to this preferred embodiment of the present invention can have a narrower width than the conventional one, thus decreasing the capacitance that is created at an intersection between the lines. Furthermore, since the intersection has a flat structure, there is no concern about disconnection. To further reduce the capacitance at the intersection, the gate line 103 may also have a locally decreased width at the intersection between the gate line 103 and the source line 105 as shown in FIG. 2C.

In the specific example illustrated in FIGS. 2A and 2B, the gate lines 103 are formed as inlaid interconnects. Alternatively, the source lines 105 may be inlaid instead of the gate lines 103 and staggered TFTs may be formed on the source lines 105. It is naturally possible to form MIM devices in place of the TFTs.

Hereinafter, it will be described with reference to FIGS. 3A through 3B how to form the inlaid gate line 103.

Figure 3A:
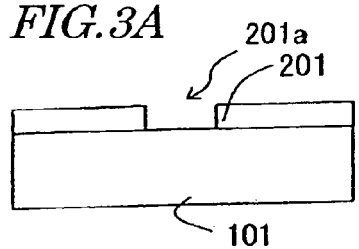
FIGS. 3A through 3E are cross-sectional views illustrating respective process steps for making the active-matrix substrate shown in FIGS. 2A and 2B.

First, as shown in FIG. 3A, a glass substrate 101 is prepared. The surface of the glass substrate 101 is coated with an HMDS solution and thereby silylated to increase the degree of contact between a photoresist layer that will be formed thereon to define an etching mask 201 and the surface of the glass substrate 101. Also, by performing this silylation process, the interface between the etching mask 201 and the glass substrate 101 will be made water repellent and the abnormal side-etching phenomenon will be minimized. Once the glass substrate 101 has been subjected to the silylation process, the surface of the glass substrate 101 is coated with a photoresist material (e.g., a novolac resist having acid resistance), which is then subjected to a photolithographic process to define the etching mask 201 having an opening 201a as shown in FIG. 3A.

Figure 3B:
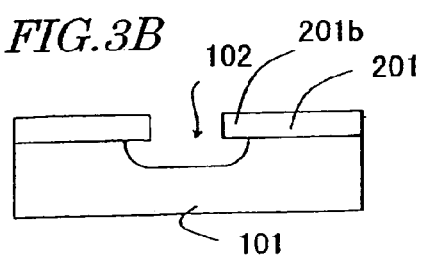

Next, as shown in FIG. 3B, a portion of the surface of the glass substrate 101 that is exposed inside the opening 201a is wet-etched by using an etchant including hydrofluoric acid, ammonium fluoride and hydrochloric acid or oxalic acid. In this preferred embodiment, the wet etching process is preferably performed at 25° C. by using a 1:3:5 mixture of hydrofluoric acid, ammonium fluoride and hydrochloric acid (unit: mol/kg). Since the etchant according to the present invention is used in this process step, the resultant etch rate will be sufficiently high, no metal salts will be produced and a uniformly etched surface with a small roughness can be obtained. In addition, since the etch rate is high, the abnormal side-etching phenomenon hardly occurs on the sidewall of the groove and the side-etching reaction itself is significantly decreased due to the water repellence that has been created by the silylation process. Accordingly, the resultant groove 102 satisfies the relationship $r \leq d$, where r is the radius of curvature of the sidewall of the groove 102 and d is the depth of the groove 102. Consequently, a portion 201b of the etching mask 201 is left so as to expand toward the groove 102.

Figure 3C:
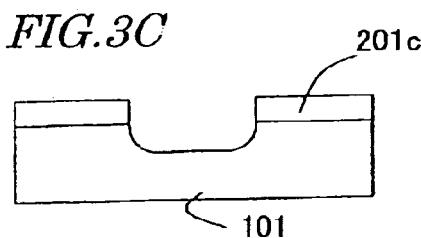

Subsequently, as shown in FIG. 3C, the expanding portion 201b of the etching mask 201 is removed selectively by ultrasonic cleaning the substrate shown in FIG. 3B in water (i.e., a liquid to which the photoresist material is resistant) at a frequency of 20 kHz to 1 MHz, for example. On the other hand, the remaining portion 201c of the etching mask 201 on the glass substrate 101 has been adhered to the surface of the glass substrate 101 firmly enough, and does not peel off the glass substrate 101 even under the ultrasonic wave applied. In this preferred embodiment, the silylation process has been carried out on the interface between the etching mask 201 and the surface of the glass substrate 101. Accordingly, the etching mask 201c can be kept adhered even more strongly to the surface of the glass substrate 101.

Figure 3D:
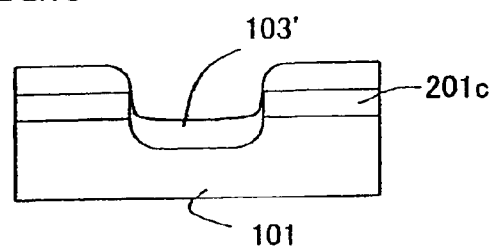

Thereafter, as shown in FIG. 3D, a conductive material 103' is deposited by a sputtering process, for example, over the glass substrate 101 as well as over the etching mask 201c. The conductive material 103' should preferably be deposited to a thickness that is approximately equal to the depth of the groove 102. The conductive material 103' does not have to be a single material but may include multiple different materials to form a multilayer structure. Examples of preferred conductive materials include Ti, Al, Ta, Mo and other metal materials. Since each of these metal materials has opacity, the material deposited may also serve as a light blocking film for the channel region of the TFT. The conductive material 103' does not have to be deposited by a sputtering process, but may be deposited by a plating technique, a CVD process or any other suitable technique.

Figure 3E:
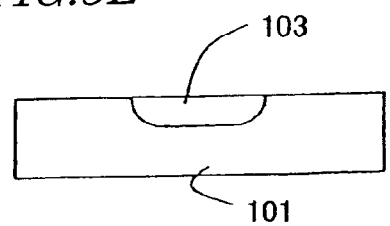

Next, the etching mask 201c is removed by a known resist stripping process. In this process step, the excessive portions of the conductive material 103' that have been deposited on the etching mask 201c are removed (i.e., lifted off) along with the etching mask 201c. As a result, a gate line 103 can be formed inside the groove 102 so as to be flush with the surface of the glass substrate 101 as shown in FIG. 3E.

Thereafter, a gate insulating film is deposited and source lines and TFTs are formed by respective known techniques, thereby completing the active-matrix substrate 100 shown in FIGS. 2A and 2B.

In the specific example described above, a pattern for the gate line 103 is defined by a lift-off process. Alternatively, the pattern for the gate line 103 may also be defined in the following manner. Specifically, first, when the groove 102 is formed, the etching mask 201 is stripped. Next, the conductive material 103' is deposited over the glass substrate 101 as well as inside the groove 102. Then, a photolithographic process (including the process steps of forming a photoresist layer, exposing, etching and stripping the resist pattern) may be carried out so as to leave only the selected portion of the conductive material 103' that fills the groove 102 and thereby form the gate line 103. In that case, however, the number of process steps needed increases compared to the process shown in FIGS. 3A through 3E.

If an ideal isotropic etching process is realized, then a relationship $L = 2d + \delta$ is satisfied, where L is the width of the groove (i.e., the line width of the interconnect), d is the depth of the groove and $\delta$ is the line width of the resist pattern (i.e., the width of the opening of the etching mask). Supposing a groove needs to be formed to a depth d of about 1 μm by using an i-line for a photolithographic process with a resolution limit of about 1.5 μm, the resultant groove (or interconnect) can have a width of about 3.5 μm. Even if this interconnect is made of a currently available wire material and applied to a high definition liquid crystal display device having a diagonal size of about 30 inches, the interconnect still achieves a sufficiently low resistance value. Thus, even when the interconnect needs to have a line width of about 10 µm in the prior art, the line width can be narrowed to about 3.5 µm according to the preferred embodiment of the present invention.

For example, if an active-matrix substrate for a 30-inch QXGA (having a resolution of 2048×1536 (R, G, B) pixels) is formed so as to include gate lines having a thickness of 1 µm and a width of 6 µm and source lines having a thickness of 0.5 µm and a width of 4 µm by utilizing the inlaid gate line structure described above, then the aperture ratio of about 65% of the conventional display device can be increased to about 83%. In addition, since a decreased capacitance is created at each intersection between two lines, the power dissipation of the display device can be reduced to approximately half of the conventional display device.

Hereinafter, a liquid crystal display device 400, which includes an active-matrix substrate with inlaid interconnects according to this preferred embodiment of the present invention, will be described with reference to FIGS. 4A and 4B. FIG. 4A is a plan view illustrating the active-matrix substrate 420 of the liquid crystal display device, 400 and FIG. 4B is a cross-sectional view of the liquid crystal display device 400 taken along the line IVb—IVb shown in FIG. 4A.

Figure 4B:
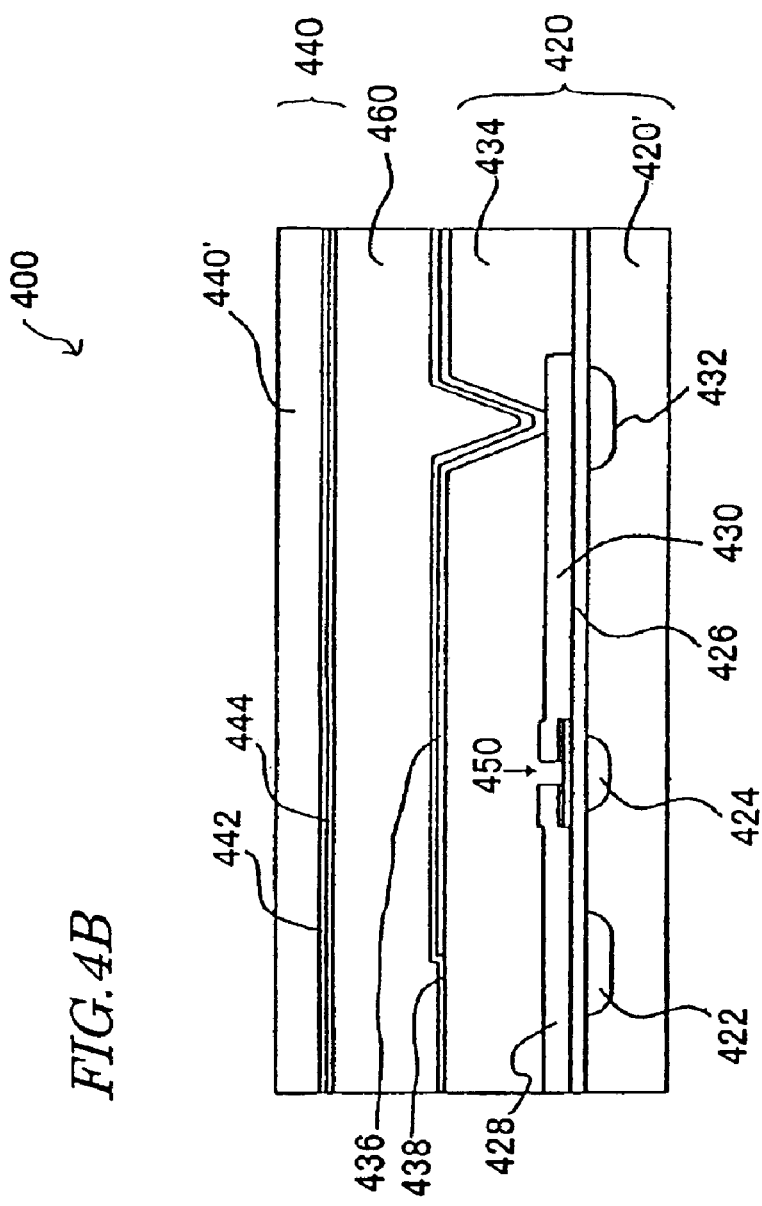
FIG. 4B is a cross-sectional view of a liquid crystal display device 400 including the active-matrix substrate 420 as viewed along the line IVb—IVb shown in FIG. 4A.
Figure 4A:
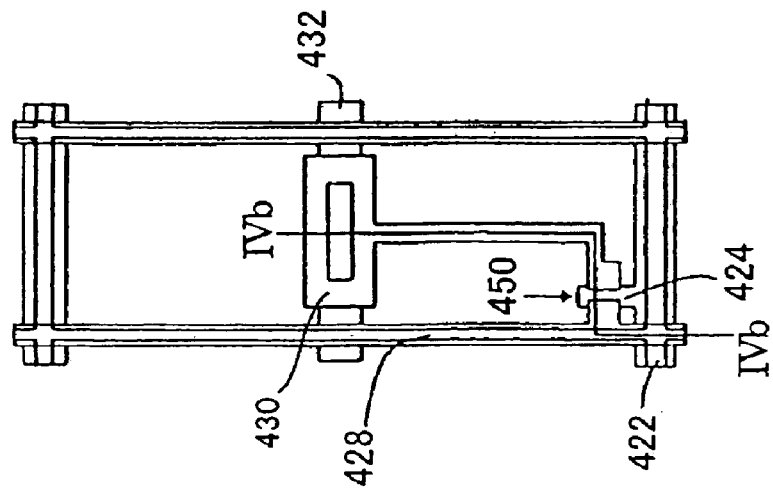
FIG. 4A is a plan view of an active-matrix substrate 420 including inlaid interconnects according to a preferred embodiment of the present invention.

As shown in FIG. 4B, the liquid crystal display device 400 includes the active-matrix substrate 420 and a counter substrate 440 that are disposed so as to face each other and a liquid crystal layer 460 that is sandwiched between these substrates 420 and 440.

Hereinafter, the configuration of the active-matrix substrate 420 will be described. As shown in FIGS. 4A and 4B, the active-matrix substrate 420 includes gate lines 422, source lines 428 and a TFT 450. The gate lines 422 and the source lines 428 are arranged on a glass substrate 420' so as to cross each other with a gate insulating film 426 interposed between them. The TFT 450 is disposed near the intersection between the gate and source lines 422 and 428.

The active-matrix substrate 420 further includes a storage capacitance line 432, a drain line 430 and a pixel electrode 436. The storage capacitance line 432 is disposed so as to extend substantially parallelly to the gate line 422. The drain line 430 is connected to the TFT 450. The pixel electrode 436 is connected to the drain line 430 by way of a contact hole, which has been formed in an interlevel dielectric film 434. An alignment film 438 has been formed on the substrate 420', including these elements and lines thereon, to control the orientation directions of liquid crystal molecules in the liquid crystal layer 460.

In the active-matrix substrate 420, the gate line 422, gate electrode 424 that extends from the gate line 422, and storage capacitance line 432 are inlaid in the grooves that have been formed on the surface of the glass substrate 420'. These members 422, 424 and 432 are embedded so as to have a surface that is substantially flush with the surface of the glass substrate 420' as in the active-matrix substrate 100 shown in FIG. 3E. Accordingly, the gate insulating film 426 has a substantially flat surface, and the source lines 428 will not be disconnected because the source lines 428 have been formed on that flat surface of the gate insulating film 426.

In the active-matrix substrate 420 having such a configuration, a write timing signal is supplied to the gate electrode 424 of the TFT 450 by way of the gate line 422, thereby turning the TFT 450 ON. In response, a desired voltage is applied to the pixel electrode 436 in accordance with a data signal that is supplied to the source line 428 at that time. It should be noted that a storage capacitance is formed by the storage capacitance line 432, drain line 430 and insulating film 426 interposed between these lines 432 and 430.

On the other hand, the counter substrate 440 includes a glass substrate 440' and a counter electrode 442 and an alignment film 444 that have been formed in this order on the glass substrate 440'.

In the liquid crystal display device 400, a desired voltage, generated by the pixel electrode 436 and the counter electrode 442, is applied to the liquid crystal layer 460, thereby modulating the incoming light that is being transmitted through the liquid crystal layer 460. In this manner, the liquid crystal display device 400 displays an image thereon.

In the specific example illustrated in FIGS. 4A and 4B, the buried structure according to the preferred embodiment of the present invention is applied to the gate lines and other members of the liquid crystal display device including reverse staggered TFTs. Alternatively, the buried structure is also applicable to the source lines and drain electrodes of a liquid crystal display device having staggered TFTs of the type shown in FIG. 5.

Figure 5:
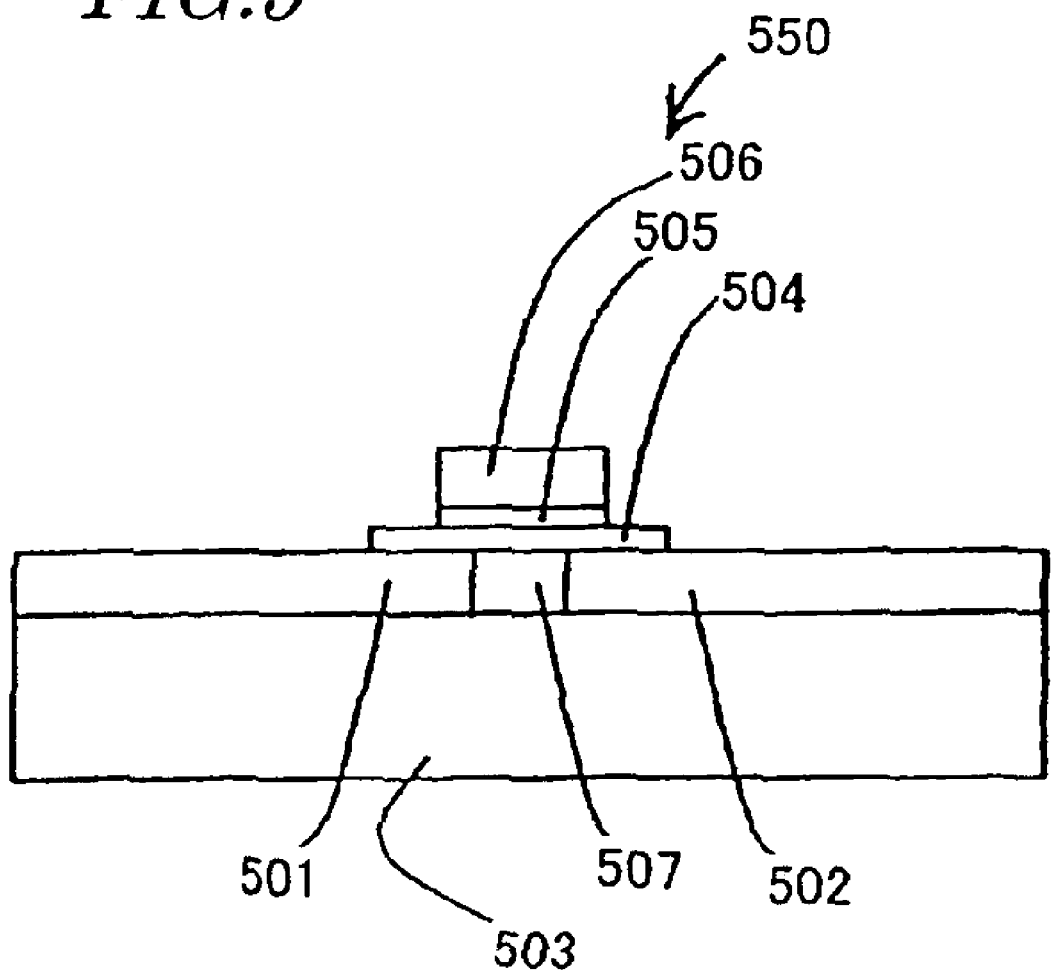
FIG. 5 is a cross-sectional view schematically illustrating the structure of a staggered TFT according to a preferred embodiment of the present invention.

In the staggered TFT 550 shown in FIG. 5, the source electrode 501 and drain electrode 502 thereof are embedded in a glass substrate 503 through the same process as that described above. Also, a semiconductor layer (e.g., an amorphous silicon layer) 504 has been formed on the glass substrate 503 so as to overlap with the source and drain electrodes 501 and 502. On the semiconductor layer 504, a gate insulating film 505 and a gate electrode 506 are stacked in this order. Also, a light blocking layer 507 is provided between the source and drain electrodes 501 and 502 to prevent the incoming light from entering the channel region of the semiconductor layer 504. The light blocking layer 507 is preferably electrically insulated and made of a light blocking material with a low reflectivity (e.g., a black photoresist material). It should be noted that when the semiconductor layer 504 is made of some light resistant material (e.g., polysilicon), the light blocking layer 507 may be omitted.

Hereinafter, it will be described with reference to FIGS. 6A through 6E how to form the TFT 550.

Figure 6A:
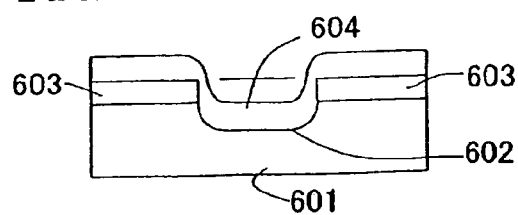
FIGS. 6A through 6E are cross-sectional views illustrating respective process steps for fabricating the staggered TFT shown in FIG. 5.

First, as shown in FIG. 6A, a groove 602 is formed on the surface of a glass substrate 601 through the same process step as that shown in FIG. 3A. The expanding portion of a first photoresist layer 603 is removed and then a metal material 604 to be patterned into source and/or drain electrodes is deposited by a sputtering process, for example, to a thickness that is approximately equal to the depth of the groove 602. In this manner, a metal layer 604 is formed over the glass substrate 601.

Figure 6B:
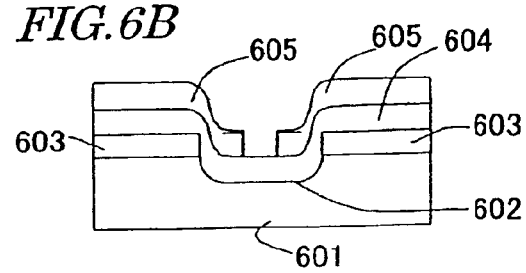

Next, as shown in FIG. 6B, a second photoresist layer 605 is formed on the metal layer 604 and a portion of the second photoresist layer 605, under which a light blocking layer should be formed, is removed by a patterning technique.

Figure 6C:
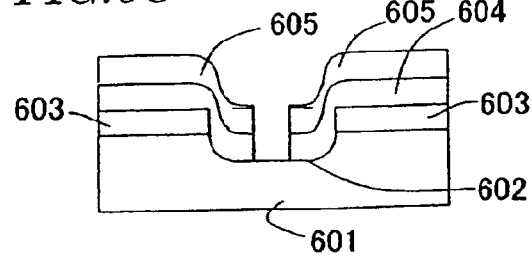

Subsequently, as shown in FIG. 6C, a portion of the metal layer 604, in which the light blocking layer should be formed, is removed by a dry etching process. The dry etching process may be a reactive ion etching (RIE) process that uses a chlorine gas such as $BCl_3$ gas.

Figure 6D:
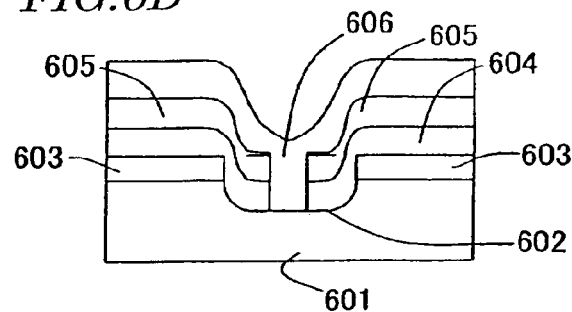

Thereafter, as shown in FIG. 6D, a light blocking material 606 is deposited over the entire surface of the second photoresist layer 605 as well as inside the opening that runs through the second photoresist layer 605 and the metal layer 604.

Figure 6E:
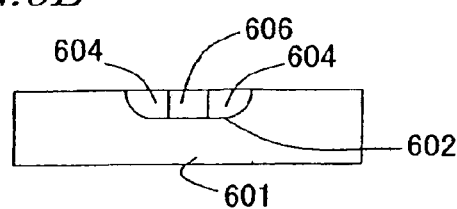

Then, the first and second photoresist layers 603 and 605 are removed by a resist stripping process. In this process step, excessive portions of the metal material 604 on the first photoresist layer 603 and those of the light blocking material 606 on the second photoresist layer 605 are both lifted off. As a result, a light blocking layer 606 is formed inside the groove 602 so as to divide the remaining portion of the metal layer 604 into two as shown in FIG. 6E.

In this manner, the light blocking layer 606 is formed between the inlaid source and drain electrodes. This buried structure has a flat upper surface.

Thereafter, the semiconductor layer 504, gate insulating film 505 and gate electrode 506 are formed in this order thereon by known techniques, thereby completing the TFT 550 shown in FIG. 5.

In the TFT 550 that has been formed in this manner, the semiconductor layer 504 and gate insulating film 505 have flat surfaces. Thus, this TFT 550 allows just a small amount of leakage current to flow therethrough, seldom operates defectively, and hardly causes process-induced variations.

The buried structure according to the preferred embodiment of the present invention described above is applied to a liquid crystal display device. However, it is naturally possible to apply the buried structure to any other type of display device including an interconnection structure on a glass substrate (e.g., an organic EL display device).

Various preferred embodiments of the present invention described above provide a substrate having a buried structure (such as an inlaid interconnect that has been formed on the surface of a glass substrate), a display device including such a substrate, a method of making the substrate and a method of fabricating the display device. According to preferred embodiments of the present invention, a groove can be formed so as to satisfy a relationship $d \geq r$, where d is the depth of the groove and r is the radius of curvature of the sidewall of the groove. In addition, the buried structure can be formed so as to have a surface that is substantially flush with the surface of a glass substrate. The buried structure according to preferred embodiments of the present invention is effectively applicable for use as an interconnect, a light blocking film or a waveguide in various types of devices.

While the present invention has been described with respect to preferred embodiments thereof, it will be apparent to those skilled in the art that the disclosed invention may be modified in numerous ways and may assume many embodiments other than those specifically described above. Accordingly, it is intended by the appended claims to cover all modifications of the invention that fall within the true spirit and scope of the invention.

What is claimed is:

1. A method of making a substrate having a buried structure, the method comprising the steps of:
   (a) preparing a glass substrate having a principal surface;
   (b) forming a groove on the principal surface of the glass substrate by a wet etching process; and
   (c) depositing a first material over the principal surface of the glass substrate and filling the groove with the first material to form the buried structure having a surface that is substantially flush with the principal surface,
   wherein the step (b) includes the step of performing the wet etching process by using an etchant that includes hydrofluoric acid, ammonium fluoride, and either of hydrochloric or oxalic acid.

2. The method of claim 1, wherein the step (b) includes the step of forming the groove that satisfies a relationship $d \geq r$, where d is the depth of the groove and r is a radius of curvature of a sidewall of the groove.

3. The method of claim 1, wherein the step (a) includes the step of preparing the glass substrate that is mainly composed of silicon dioxide and that additionally includes a non-silicon-dioxide metal oxide.

4. The method of claim 3, wherein the step (a) includes the step of preparing the glass substrate that is made of non-alkali glass.

5. The method of claim 3, wherein the step (a) includes the step of preparing the glass substrate that is made of soda lime glass.

6. The method of claim 1, wherein the step (b) includes the step of defining an etching mask that exposes a region of the principal surface of the glass substrate in which the groove will be formed, and
   wherein the step (c) includes the step of removing the first material from the principal surface of the glass substrate, except a portion of the first material that fills the groove, by a lift-off process using the etching mask.

7. The method of claim 6, wherein the step (b) further includes the step of subjecting the principal surface of the glass substrate to a surface treatment to make the etching mask contact with the principal surface more closely before the step of defining the etching mask is performed.

8. The method of claim 7, wherein the step (b) includes the steps of subjecting the principal surface to a silylation process as the surface treatment and defining a photoresist pattern as the etching mask on the principal surface.

9. The method of claim 1, wherein the step (c) includes the step of depositing the first material by a sputtering process.

10. The method of claim 1, wherein the step (c) includes the steps of depositing a conductive material as the first material and forming an interconnect as the buried structure.

11. The method of claim 1, wherein the step (c) includes the steps of depositing a light blocking material as the first material and forming a black matrix as the buried structure.

12. The method of claim 1, wherein the step (c) includes the steps of depositing a transparent material as the first material and forming a waveguide as the buried structure.

13. A method for fabricating a display device, the display device including an active-matrix substrate and a display medium layer,
   wherein the method for fabricating the display device includes the step of making the active-matrix substrate by the method as recited in claim 10.

14. The method of claim 13, wherein the buried structure is a gate line, and
   wherein the step of making the active-matrix substrate includes the step of forming a reverse staggered TFT on the gate line.

15. The method of claim 13, wherein the buried structure is a source line, and
   wherein the step of making the active-matrix substrate includes the step of forming a staggered TFT on the source line.

16. A method for fabricating a display device, the display device including an active-matrix substrate and a display medium layer,
   wherein the step of making the active-matrix substrate is performed by the method of making the substrate having the buried structure as recited in claim 11.

* * * * *